United States Patent [19]

Shibata

[11] Patent Number: 5,416,438
[45] Date of Patent: May 16, 1995

[54] ACTIVE FILTER CIRCUIT SUITED TO INTEGRATION ON IC CHIP

[75] Inventor: Hirohiko Shibata, Tokyo, Japan

[73] Assignee: NEC Corporation, Tokyo, Japan

[21] Appl. No.: 34,394

[22] Filed: Mar. 18, 1993

[30] Foreign Application Priority Data

Mar. 18, 1992 [JP] Japan ................. 4-061602

[51] Int. Cl.⁶ ............................................... H03K 5/00
[52] U.S. Cl. .................... 327/552; 327/142; 327/553
[58] Field of Search ............ 307/520, 521, 491; 328/167; 327/362, 344, 553, 552, 77, 551

[56] References Cited

U.S. PATENT DOCUMENTS

| 4,791,379 | 12/1988 | Hughes | 307/521 |
| 4,851,719 | 7/1989 | Hitomi | 307/521 |
| 5,187,445 | 2/1993 | Jackson | 307/521 |
| 5,227,743 | 7/1993 | Yamamoto | 328/167 |
| 5,245,646 | 9/1993 | Jackson et al. | 307/521 |

FOREIGN PATENT DOCUMENTS 473886 11/1992 Japan .

OTHER PUBLICATIONS

"High-Frequency CMOS Continuous-Time Filters", H. Khorramabadi and P. Gray, IEEE Journal of Solid-State Circuits, vol. SC-19, No. 6, Dec. 1983, pp. 939-948.
"Gyrator Video Filter IC with Automatic Tuning", K. Moulding et al., IEEE Journal of Solid-State Circuits vol. SC-15, No. 6, Dec. 1980, pp. 963-968.

Primary Examiner—Timothy P. Callahan
Assistant Examiner—Toan Tran
Attorney, Agent, or Firm—Sughrue, Mion, Zinn, Macpeak & Seas

[57] ABSTRACT

An active filter circuit has been proposed which is fabricated on a chip and which comprises a two-input operational amplifier with one input for feedback, and a first capacitance element connected between the other input of the operational amplifier and the ground potential. It further comprises a main resistor and the supplemental resistors interconnected in series or parallel, and switches corresponding to the supplemental resistors and turned on or off by control signals, thereby the summed resistance of these supplemental resistors is adjustable to set the time constant created in combination with the capacitance of the first capacitor to a specified value. Input signals are routed to the other input of the operational amplifier via the resistor circuit consisting of the main and supplemental resistors and the switches. According to the present invention, the time constant is detected with a probe pulse by measuring discharge time of the second capacitor. According to the detection results, the control signals are outputted to correct the deviation of the time constant from the specified value.

3 Claims, 3 Drawing Sheets

ACTIVE FILTER CIRCUIT SUITED TO INTEGRATION ON IC CHIP

BACKGROUND OF THE INVENTION

1. Field of the Invention

This invention relates to an active filter circuit combining an operational amplifier, a capacitor and a resistor, and more particularly to the same fabricated on a single semiconductor chip as an integrated circuit (IC).

2. Description of the Prior Art

Active filter circuits are widely used for a variety of purposes of removing the quantizing noise associated with A/D conversion and shaping signal waveforms. The capacitance value of the capacitor and the resistance value of the resistor depend on the resistivity and dielectric constant of materials and thus vary with geometry and dimensions thereof. As well known in the art, these values are inevitably deviated in the IC from designed values by about 20 to about 30% due to the occasional state of the material and ununiform temperature in the fabrication process and by precision for processing into a desired geometry. Consequently, it is usual for the cut-off frequency and the pass-band width of the active filter circuit to deviate much from the designed values.

In order to correct deviation of the above-mentioned cut-off frequency and pass-band width, there are fabricated on such an IC chip a circuit consisting of a capacitor and a plurality of resistors interconnected in series or parallel thereto. Some of the resistors are provided with respective shunt fuses to be selectively blown for adjusting the summed resistance of the circuit on the measured result after completion of the semiconductor chip. This adjustment is usually carried out to keep at a certain value the time constant, that is, the product of the capacitance and resistance of the RC circuit, and therefore the minimum value of the summed resistance when no fuses are blown is set to correspond to the largest allowable deviation of the capacitance. Another method is used which is a laser-trimming technique of previously fabricating a square-film resistor connected in series to the capacitor on the chip and cutting a slit of a suitable length in the resistor film by means of laser beam so as to set its resistance to a desired value.

In addition to the methods of fuse-blowing and laser trimming, some methods of self-correcting the values of capacitor and resistor have been proposed. For example, an article entitled "High frequency CMOS continuous time filters" IEEE Journal of Solid-State Circuits, vol. SC-19, December 1984, pp. 939–948 describes a voltage-controlled oscillator (VCO) and a phase comparator, these constituting a phase locked loop (PLL), and an active filter, all built on the same chip. The phase comparator compares in phase between the output of the VCO and an external reference frequency or high precision clock signal and generating control voltages. The voltage-controlled oscillator includes a CR integrator circuit controlled by the cotrol voltages, in which a voltage-controlled current source having a mutual conductance is contained. The active filter contains CR integrators of the same type as the CR integrators in the VCO. The (oscillation) frequency of VCO is synchronized with the above-mentioned clock signals, whereby the time constant of the above-said integrator circuits is corrected. The above-said common control voltages are applied not only the VCO but also the integrators which are components of the filter, and therefore correction of these integrators on the same chip is carried out simultaneously as the integrator circuit of VCO.

Another article entitled "Gyrator video filter IC with automatic tuning" IEEE Journal of Solid-State Circuits, Vol. SC-15, November 1980, pp. 963–968 describes a filter for TV video signal frequency band which has a self-corrector circuit with a variable bipolar-transistor gyrator as a phase shifter.

In addition, Japanese Published Patent No. Hei.4-73886 specification describes a method of adjusting the time constant of a built-in active filter of the integrated circuit by using a time constant-variable current source.

On the active filter circuits in the prior art, those processed by the above-mentioned fuse blowing and laser trimming need equipment for checking capacitances and resistances, fuse blowing, and laser processing, and the correspondingly-added processing steps, with correspondingly-increased manufacture costs. Besides, fuse blowing and laser beam irradiation provide stress on the semiconductor substrate and the devices-/interconnections on its surface, resulting in decreased reliability of the semiconductor IC itself including such a filter circuit as mentioned above.

In addition the above-mentioned self-correcting circuits need current source or variable gyrator and many elements for the associated peripheral circuits, these not only taking up large surface on the substrate surface but also imposing limitation on the operational frequency range.

SUMMARY OF THE INVENTION

It is therefore an object of the present invention to provide an active filter comprising on a chip resistors used for fine adjustment with need for neither fuse blowing nor laser trimming.

Another object of the present invention is to provide such an active filter circuit having a wide adjustable frequency range.

An active filter circuit according to the present invention is fabricated on a chip and comprises an active filter section and a time-constant detector section. The active-filter section includes a two-input operational amplifier with the output thereof connected to the first input thereof, a first capacitor connected between the second input of the operational amplifier and the referential potential, a resistor circuit consisting of a main resistor and the supplemental resistors, and a switch circuit consisting of switches corresponding to the supplemental resistors, thereby input signals being routed to the second input of the operational amplifier through the summed resistance adjustable by on-off switching of the switches in response to control signals, and a specified time constant being secured by the adjusted summed resistance and the capacitance of the first capacitor. The time-constant detector section includes on the chip a second capacitor with one terminal thereof connected to the reference potential, the second capacitor being formed in substantially the same processing steps as formed the first capacitor, a resistor connected between a probe input terminal to which a probe pulse is applied and the other terminal of the second capacitor, a voltage divider for generating a reference voltage from the supply voltage, a voltage comparator for comparing the voltage of the other terminal of the second capacitor with the reference voltage, an AND circuit, clock pulses and the voltage outputted from the voltage comparator being applied thereto, for delivering the AND outputs, a counter for counting, upon being reset by the probe pulse, the pulse train from the AND circuit, and an encoder for translating the outputs thereof into binary codes and outputting the binary codes as control signals to the switches.

The active filter circuit according to the present invention permits to correct exactly without needing the above-mentioned fuse-links blowing or laser trimming, and this makes unneedful not only equipment for such adjustment processing as well as the above-mentioned measurement at inspection stage but also the correspondingly-added processing steps for adjustment of resistances and capacitance, contributing to manufacture costs. Besides, the chip undergoes no stress due to fuse blowing and laser trimming, with the consequence of removing cause of decreasing the reliability of semiconductor IC itself.

BRIEF DESCRIPTION OF THE DRAWINGS

The above-mentioned and other objects, features and advantages of this invention will become more apparent with reference to the following detailed description taken in conjunction with the accompanying drawings, wherein:

FIG. 1 is a circuit diagram of a filter in the prior art;
FIG. 3 is a waveform diagram for the embodiment.

DETAILED DESCRIPTION OF THE PREFERRED EMBODIMENTS

Figures 1, 3:
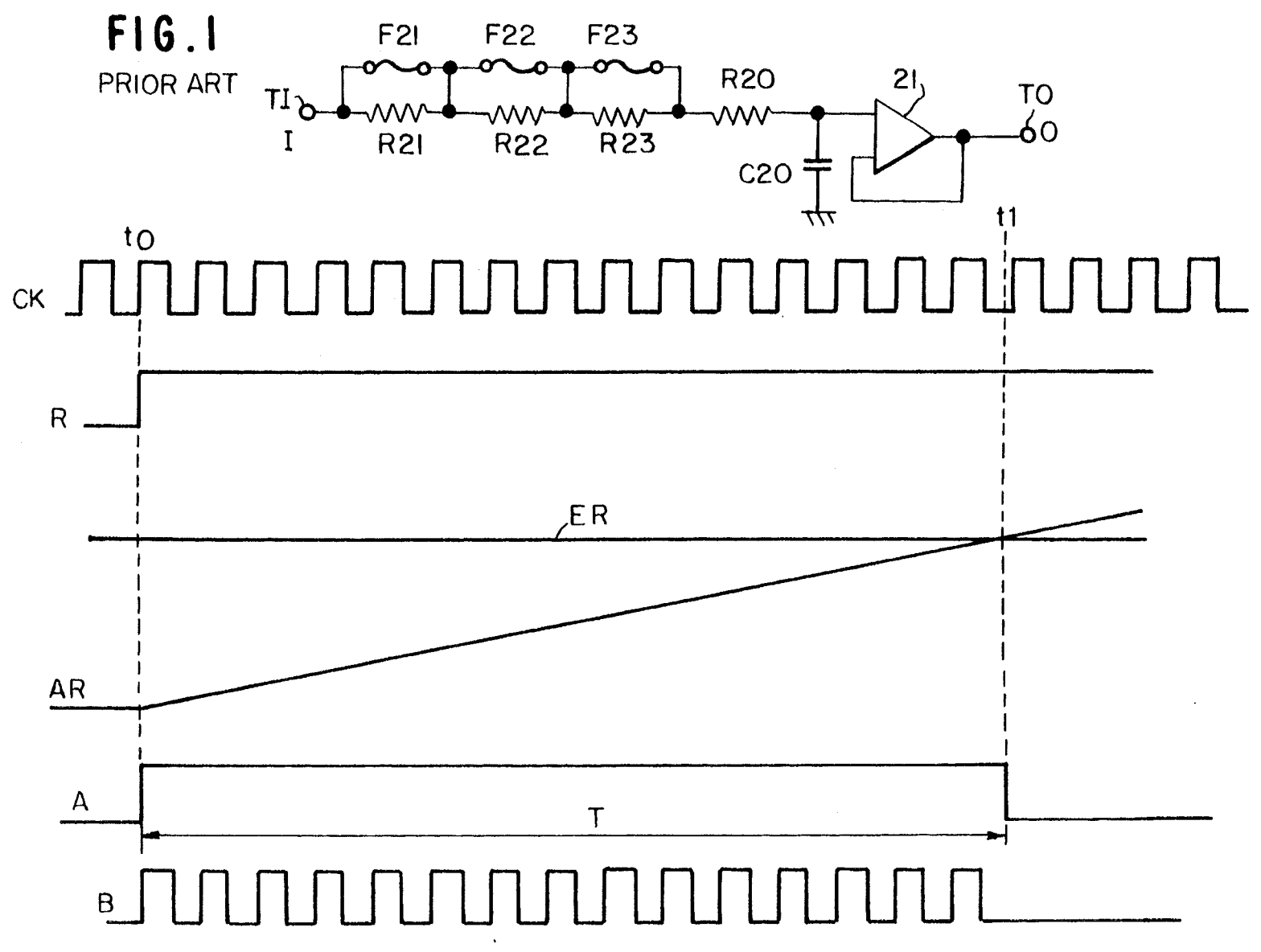

Referring to FIG. 1, a prior art filter circuit as shown comprises an two-input operational amplifier 21 of which one input is for feedback, capacitor C20 which is connected between the other input of the operational amplifier 21 and the ground potential, and a plurality of resistors R20, R21, R22 and R23 connected between the other input of the operational amplifier and the input terminal T1 of the filter. Resistors R20, R21, R22, and R23 are interconnected in series and the last three are shunted with fuses F21, F22 and F23, respectively. The resistance of R20 is set to the value at which a specified time constant is maintained when the capacitance of C20 is at the maximum allowable deviation. The resistances of R21, R22 and R23 are caused to add in series to resistor R20 by blowing fuse links F21, F22 and F23.

After finishing the process for manufacturing semiconductor IC containing this active filter circuit, the cutoff frequency of the active filter is adjusted to the optimum value at checking stage by applying a test input "I" to a terminal T1, measuring the test output "O" from output terminal TO, and according to the result, blowing selectively fuse links F21, F22 and F23.

Figure 2:
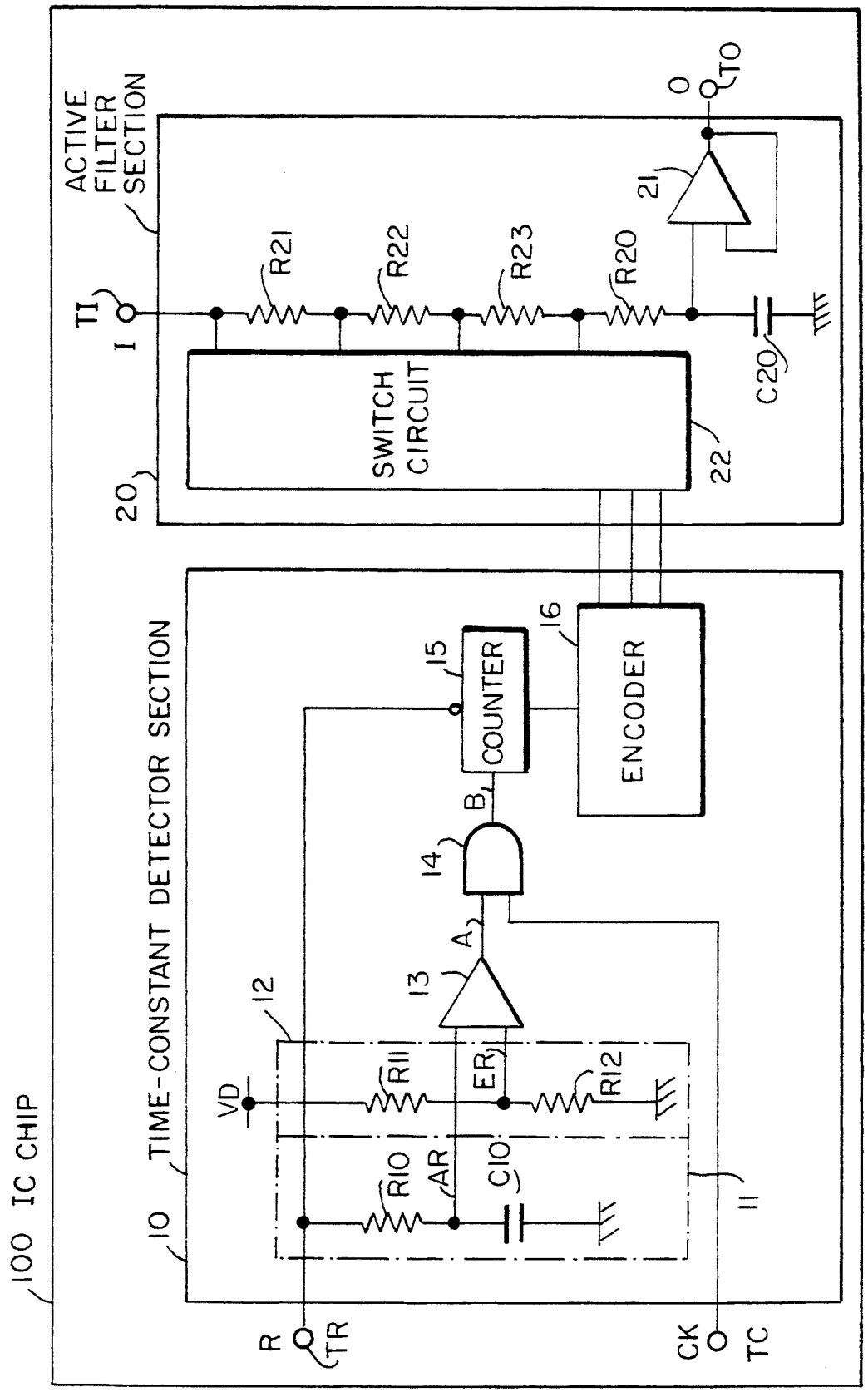
FIG. 2 is a circuit diagram illustrative of an embodiment of the present invention.

Referring to FIG. 2, the filter circuit of this embodiment consists of a time-constant detector section 10 and an active filter section 20 controlled by detector 10 on a single semiconductor chip 100.

Referring additionally to FIG. 3, detector section 10 is constructed of a time constant circuit 11 for generating a discharge waveform "AR", which consists of a resistor R10, which is connected between input terminal TR to which a time-constant probe pulse "R" is applied and the ground potential, and a capacitor C10; a reference voltage circuit 12 for generating a reference voltage "ER", which consists of resistors R11, R12 for dividing supply voltage "VD"; a comparator 13 to which discharge waveform "AR" and reference voltage "ER" are supplied and of which the output "A" is kept at logic level "H" until the rising "AR" reaches "ER"; an AND circuit 14 generating a pulse train B of logic products of output "A" and clock pulses "CK" from terminal TC; a 4-bit pulse counter 15 for counting the pulse train B; and a decoder 16 for converting the count into a parallel-3-bit switch-control signal "CT".

Active filter section 20 is constructed of an operational amplifier 21 similar to the prior art active filter diagrammed in FIG. 1; a capacitor C20; resistors R20, R21, R22 and R23 interconnected in series; and a switch circuit 22 controlled to switch for making selectively short shunts for resistors R21, R22 and R23.

At time t0 the time-constant probe pulse R resets counter 15, and simultaneously waveform "AR" begins to rise. The output "A" of the comparator is maintained at logic level "H" as far as the voltage of waveform "AR" is lower than reference voltage "ER", and during this period AND circuit 14 outputs pulse train "B" of the logic products of the comparator output "A" and clock pulses "CK". At time t1 when waveform "AR" reaches reference voltage "ER", comparator output "A" moves to level "L", which in turn pulse train"B" interrupts. In this case, the time period"T" between times t0 and t1 is proportional to the gradient of waveform"AR", i.e. the time constant of time constant circuit 11. If this time period"T" corresponds to 15 clock pulses, the count of counter 14 is 15.

Both CR time-constant circuits, C10/R10 and C20/R20, are fabricated on one and the same chip in the same processing steps, and therefore have the same dispersion pattern. In other words, when the time constant of RC circuit 11 is large, the C20/R20 circuit is large, too. The resistance of R20 is set to the corresponding value to the maximum allowable capacitance of C20 to maintain the desired value. In this case, encoder 16 outputs signals"CT1, CT2 and CT3" driving switch circuit 22 to make short circuits for resistors R21, R22 and R23. These signals represent the number of pulses of the pulse train"B" output from AND circuit 14 correspondent to the maximum allowable value of capacitor C20. In this embodiment, the voltages of waveforms"R" and"AR" are set for the number of pulses of output"B" to be 15. With reducing number of pulses of pulse train"B" as 14, 13 and 12, control signals"CT1, CT2 and CT3" drive switch circuit 22 to add the first one, two and three resistances of R21, R22 and R23 to the resistance of R20.

Figure 4:
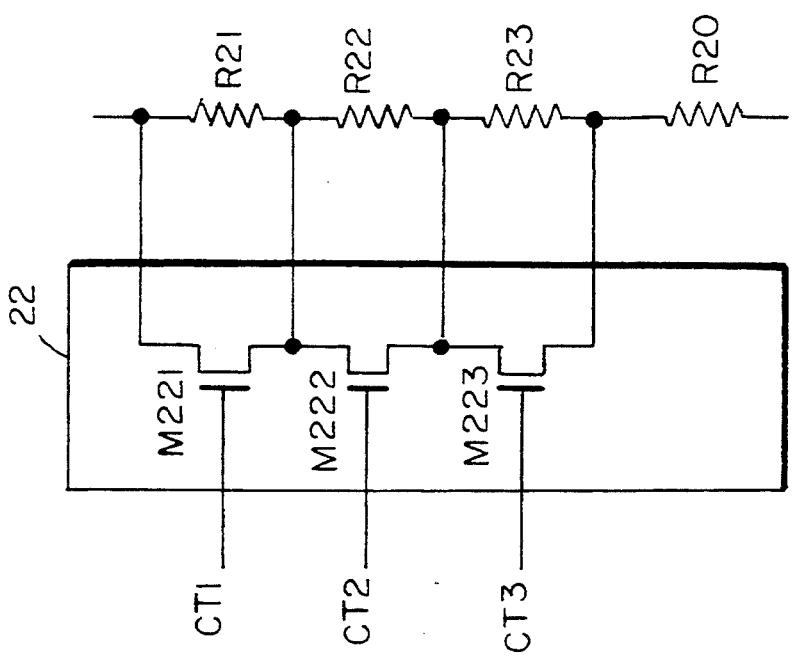
FIG. 4 is the circuit diagram of a switch circuit which is a part of the embodiment.

Referring to FIG. 4, switch circuit 22 comprises MOS transistor switches M221, M222 and M223 to response to encoder outputs CT1, CT2 and CT3 of"H"-level by making short circuits for resistors R21, R22 and R23, respectively. Decoder 16 translating decimal counts from counter 15, the number of pulses of the pulse train"B", for example, 15, 14, 13, . . . as mentioned above, to binary numbers 1111, 1110, 1101, . . . is well known to those skilled in the art and therefore the description of it is omitted.

In this embodiment, with active filter 20, for example, letting resistances of resistors be R20 10KΩ, and R21, R22 and R23 each 0.625KΩ, improvement from about 20% to about 6% in deviation of the time constant from the desired value.

Figure 5:
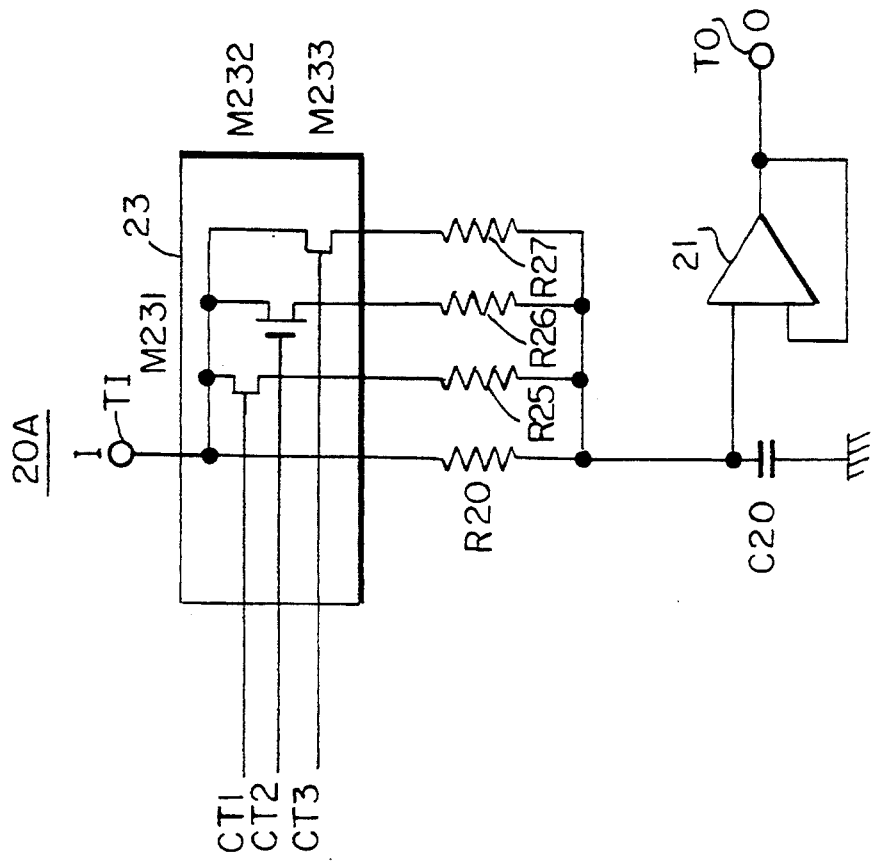
FIG. 5 is the circuit diagram of an alternative switch circuit.

Referring to FIG. 5, switch circuit 23 which is an alternative of switch circuit 22 of FIG. 4 comprises FET switches M231, M232 and M233 which are connected between terminal T1 and resistors R25, R26 and R27 and to the gates of which encoder outputs CT1, CT2 and CT3 are applied. There are further provided a resistor R20 connected in parallel to the circuits consisting of the resistors and FET switches, and a capacitor C20 connected between the node of those resistors and the ground potential. Then the resistances of R25, R26 and R27 are the summed resistances of R20 with R21, R21 and R21, respectively. Compared with switch circuit 22 which consists of FET switches M221, M222 and M223 interconnected in series, and therefore is affected by their corresponding resistances when they are turned on, the alternative switch circuit 23 shown in FIG. 5 which consists of FET switches M231, M232 and M233 interconnected in parallel can be less affected by the resistances associated with these FET switches when turned on.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. An active filter circuit fabricated on a semiconductor chip comprising an active filter section and a time-constant detector section, wherein:

said active-filter section includes:

an input terminal for an input signal and an output terminal for providing an output signal;

an operational amplifier having first and second inputs and an output connected to the first input and to said output terminal of said active-filter section;

a first capacitor connected between the second input of said operational amplifier and a reference potential;

a resistor circuit having a main resistor, a plurality of supplemental resistors, and a switch circuit having switches corresponding to said supplemental resistors, said second input of said operational amplifier receiving said input signal through said resistor circuit whose total resistance is adjustable by on-off states of said switches responsive to control signals; and said time-constant detector section includes:

a second capacitor having one terminal connected to said reference potential;

a resistor connected between a probe input terminal to which a probe pulse is applied and the other terminal of said second capacitor;

a voltage divider for generating a reference voltage;

a voltage comparator for comparing the voltage of the other terminal of said second capacitor with said reference voltage;

an AND circuit supplied with clock pulses and an output from said voltage comparator;

a counter for counting pulses derived from said AND circuit; and means responsive to a constant of said counter for producing and supplying said control signals to said switch circuit.

2. An active filter according to claim 1, wherein said main resistor and said supplemental resistors are interconnected in series, and said corresponding switches are connected in parallel to, and turned on to make short-circuits for, said supplemental resistors, respectively.

3. An active filter according to claim 1, wherein each of said supplemental resistors is connected in series with said corresponding one of said switches, respectively, to form a resistor-switch circuit and the resistor-switch circuits and said main resistor are interconnected in parallel, selected one or ones of said switches being turned on by said control signals to define said summed resistance.

* * * * *